US005264985A

United States Patent [19]

Sako et al.

[11] Patent Number: 5,264,985

[45] Date of Patent: Nov. 23, 1993

[54] APPARATUS FOR INCREASING EFFECTIVE INSULATION BETWEEN TERMINAL PLATES

[75] Inventors: Yuji Sako; Shigeharu Ootsuka, both of Nagoya, Japan

[73] Assignee: Mitsubishi Denki Kabushiki Kaisha, Tokyo, Japan

[21] Appl. No.: 787,816

[22] Filed: Nov. 5, 1991

[30] Foreign Application Priority Data

Nov. 28, 1990 [JP] Japan .................................. 2-323112

[51] Int. Cl.5 .............................................. H05K 7/02

[52] U.S. Cl. ...................................... 361/760; 174/50; 174/255; 257/678; 361/783; 361/752

[58] Field of Search ............... 361/380, 392, 394, 397, 361/399, 400, 401, 408, 412, 415, 420, 426, 427, 331, 356; 174/255, 50, 52.1; 257/678

[56] References Cited

U.S. PATENT DOCUMENTS 4,703,294 10/1987 Yokoyama et al. ................. 335/121
4,905,206 6/1978 Hishiki .................................. 336/96
5,010,432 4/1991 Fukushima et al. ................ 360/108

FOREIGN PATENT DOCUMENTS 1929219 1/1970 Fed. Rep. of Germany .
3544533 6/1987 Fed. Rep. of Germany .
8801461 3/1988 Fed. Rep. of Germany .
8808153 10/1989 Fed. Rep. of Germany .
2541507 8/1984 France .
59-189257 12/1984 Japan .
60-83292 6/1985 Japan .

*Primary Examiner*—Leo P. Picard
*Assistant Examiner*—Young S. Whang
*Attorney, Agent, or Firm*—Burns, Doane, Swecker & Mathis

[57] ABSTRACT

Electrical equipment coupled to a printed circuit board provides insulation ribs projecting from a face between terminal plates provided on an upper face of the electrical equipment. The insulation ribs are inserted into oblong holes of the printed circuit board when the electrical equipment is coupled to the printed circuit board. As a result, insulation distances, namely creepage distance, between the terminal plates are along the height of the insulation ribs projecting from the upper face of the terminal plates.

11 Claims, 10 Drawing Sheets

APPARATUS FOR INCREASING EFFECTIVE INSULATION BETWEEN TERMINAL PLATES

FIELD OF THE INVENTION

The present invention relates to electrical equipment which is coupled to a printed circuit board so as to efficiently wire the electrical equipment to the printed circuit board.

BACKGROUND OF THE INVENTION

The following is an explanation of a conventional semi-conductor circuit apparatus, for example, a conventional inverter apparatus, which is wired to a conventional printed circuit board.

FIG. 9 is a basic circuit diagram of a conventional inverter apparatus. In FIG. 9, three-phase current alternating at a power-frequency, which is inputted through power terminals 54, is converted into direct current by a diode module 51. The converted direct current is smoothed by a smoothing capacitor 53, and inputted into a transistor module 52. The transistor module 52 invents the direct current to three-phase alternating current having a desired frequency. The inverted alternating current is output from load terminals 55. The transistor module 52 is controlled by a control device 56. The above-mentioned inverter apparatus provides a resistor 57 for limiting a current surge in order to control the current surge when the inverter apparatus starts to operate. If the resistor 57 for limiting the current surge continues to operate during operation of the inverter apparatus, a voltage drop caused by the resistor 57 is generated in the inverter apparatus. For solving the above-mentioned problem, the resistor 57 is connected in the inverter apparatus only at the starting time of the inverter apparatus. Thereafter, an electromagnetic contactor 58, which creates a short circuit between the input terminal and output terminal of the resistor 57, shorts the resistor 57 during the operating time of the inverter apparatus except at the starting time.

Such an inverter circuit of an inverter apparatus, which is connected by a printed circuit board, is disclosed in Japanese published unexamined utility model application No. Sho 60-83292 (Jikkai Sho 60-83292) as a semi-conductor circuit apparatus. FIG. 10 is a cross sectional side view showing the structure of the semiconductor circuit apparatus. In FIG. 10, parts and components to which correspond like elements shown in FIG. 9 are shown by the same numerals. As shown in FIG. 10, main circuit devices, such as the diode module 51, the transistor module 52 and the smoothing capacitor 53 are located inside a base 59. The above-mentioned main circuit devices located in the base 59 are covered by a cover 65. Radiating fins 60 are provided on the bottom face of the base 59 to cool the main circuit device due to the current flowing therein. The main circuit devices are electrically connected to one another by a main circuit printed board 66. Connecting terminals 51*a*, 52*a*, 53*a* of the main circuit devices are fixed to the main circuit printed board 66 by bolts 51*b*, 52*b*, 53*b*, respectively.

As shown in FIG. 10, a control device 56 for controlling the transistor module 52 is mounted on a control circuit printed board 70 which is electrically and mechanically connected to the main circuit printed board 66 by connectors 69.

In the above-mentioned semi-conductor circuit apparatus, each insulation distance between the connecting terminals 51*a*, 52*a*, 53*a*, 53*a* of the main circuit device is formed along the surface of the main circuit printed board 66 by an insulation sheet made of a laminate plate.

If floating dust or suspended particulate stick on the main circuit printed board 66 and accumulate, the insulation along the surface of the main circuit printed board 66 deteriorates. In view of the deterioration of the main circuit printed board 66, the distance between the connecting terminals of the main circuit devices in the conventional semi-conductor circuit apparatus should be increased to insulate the area between the connecting terminals 51*a*, 52*a*, 53*a*, 53*a*. As a result, the conventional semi-conductor circuit apparatus is large in size.

As shown in FIG. 10, since there is an aperture A between a top face of the main circuit devices and a bottom face of main circuit printed board 66, the floating dust or suspended particulate are likely to collect in the aperture A. As a result, insulation deterioration occurs in the aperture A between the connecting terminals for three-phase or the connecting terminals and main circuit printed board 66.

In order to solve the above-mentioned problem, a "printed circuit board" shown in FIG. 11 is disclosed in the Japanese published unexamined utility model application No. 59-189257 (Jikkai Sho 59-189257). FIG. 11 is a cross sectional view showing a printed circuit board 508 on which a relay 505 is mounted. Connecting terminals 506, 507 of the relay 505 are inserted into holes 512, 513 of the printed circuit board 508 be in electrical connection with copper foils 509, 510. The copper foils 509, 510 are conductor foil which is printed on the printed circuit board 508. The printed circuit board 508 provides a lib-shaped projection 511 between two holes 512 and 513 to isolate two copper foils 509 and 510. In other words, a distance for insulation, namely creepage distance, between the connecting terminals 506, 507 increases by providing the projection 511 made of an insulation material.

However, the above-mentioned printed circuit board 508 cannot be manufactured by a normal etching step or drilling step of a copper-clad laminate board generally utilized for manufacturing a typical printed circuit board having a flat surface. Therefore the printed circuit board 508 has to be manufactured by a special manufacturing process for printing the circuit on the insulation board. As a result, using such a printed circuit board increases the manufacturing cost of the apparatus.

SUMMARY OF THE INVENTION

An object of the present invention is to provide electrical equipment coupled to a printed circuit board having a proper distance for insulation between connecting terminals of main circuit devices when floating dust or suspended particulate is stuck to the printed circuit board and absorbs moisture, without increasing the manufacturing cost.

In order to achieve the above-mentioned object, the electrical equipment coupled to a printed circuit board includes a case which has at least one face formed as a substantially flat and plural terminal plates connected to circuit parts on the printed circuit. At least a part of each terminal plate connected to the oriented circuit board and formed on the substantially flat face.

Also, at least one insulation rib projects between the plural terminal plates to assure a long creepage distance between the plural terminal plates and above the substantially flat face.

According to the present invention, since the electrical equipment for a printed circuit board provides insulation ribs between terminal plates which are formed to project from a top face of the printed circuit board, the insulation distance between the terminal plates is protected by the insulation rib if the printed circuit board is affected by dust or moistured damp dust etc.

While the novel features of the invention are set forth particularly in the appended claims, the invention, both as to organization and content, will be better understood and appreciated, along with other objects and features thereof, from the following detailed description taken in conjunction with the drawings.

It will be recognized that some or all of the Figures are schematic representations for purposes of illustration and do not necessarily depict the actual relative sizes or locations of the elements shown.

DESCRIPTION OF THE PREFERRED EMBODIMENTS

Figure 1:
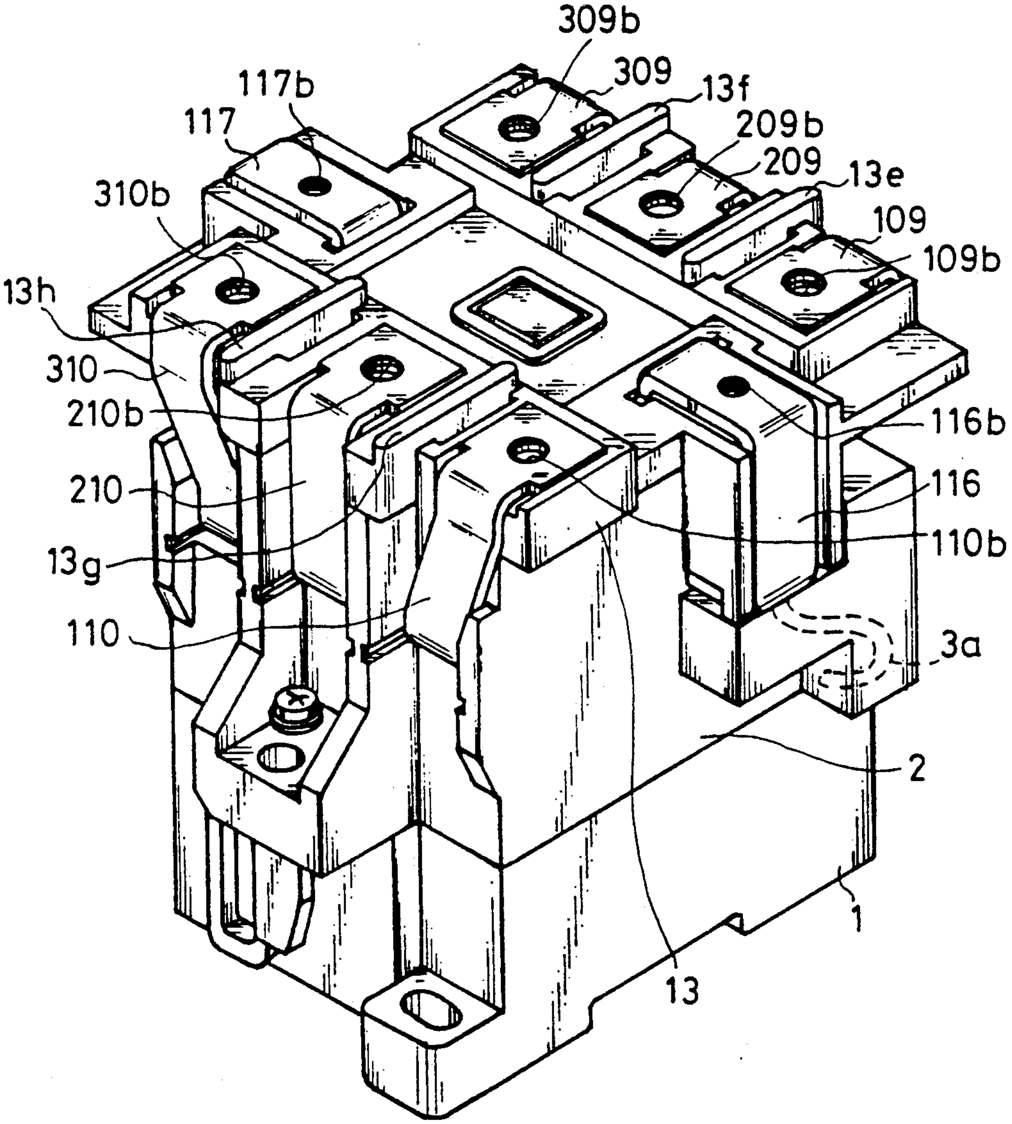
FIG. 1 is a perspective view showing an electromagnetic contactor embodying the present invention.
Figure 2:
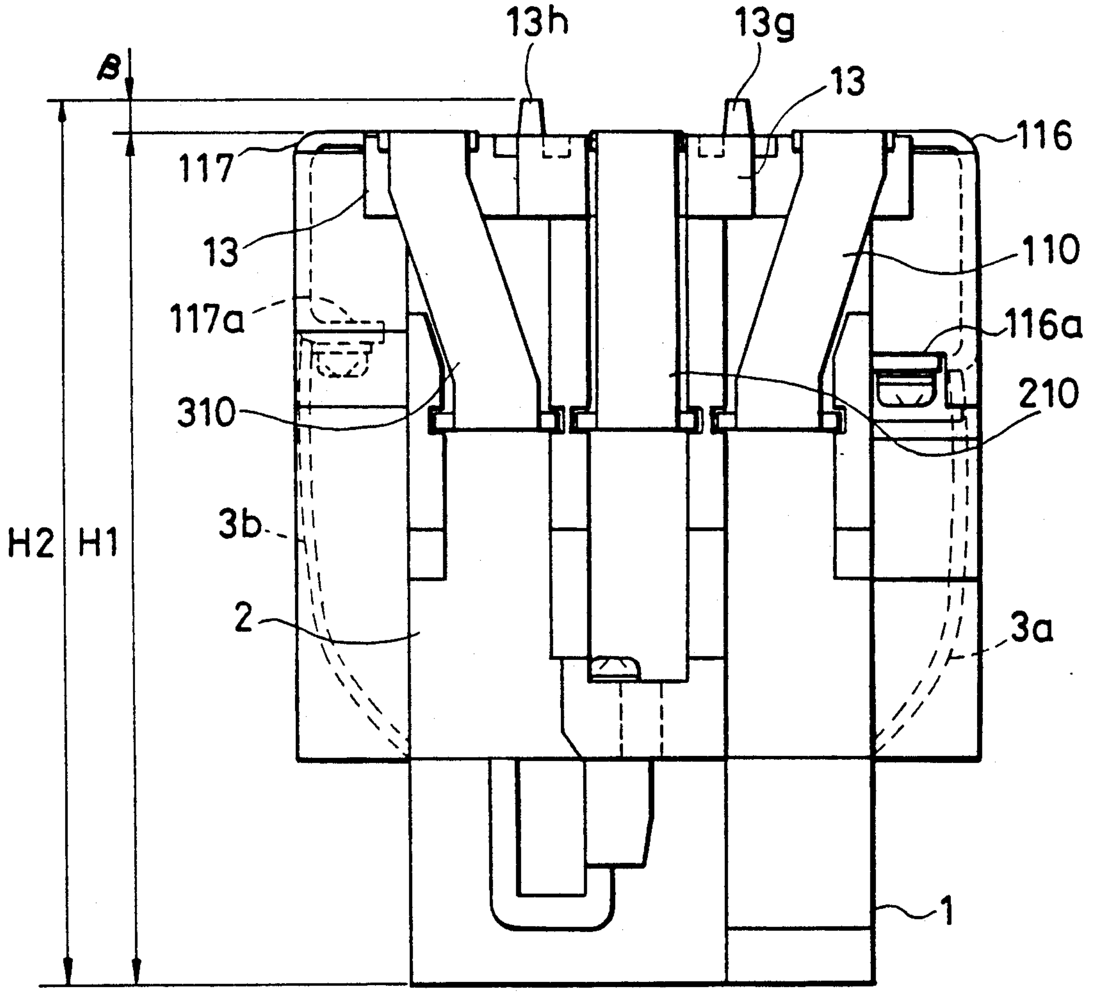
FIG. 2 is a front view showing the electromagnetic contactor of FIG. 1.
Figure 3:
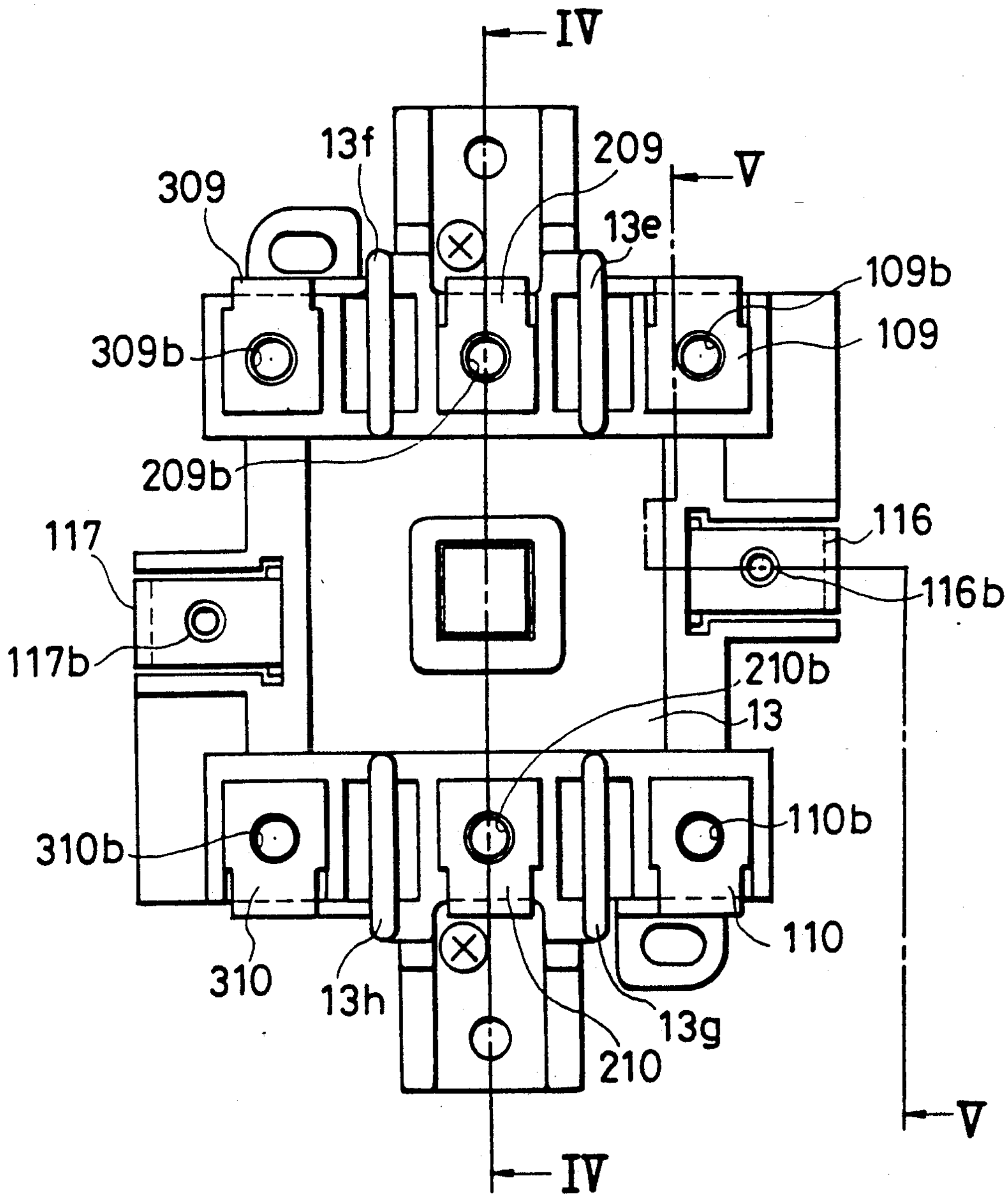
FIG. 3 is a top plan view showing the electromagnetic contactor of FIG. 1.
Figure 4:
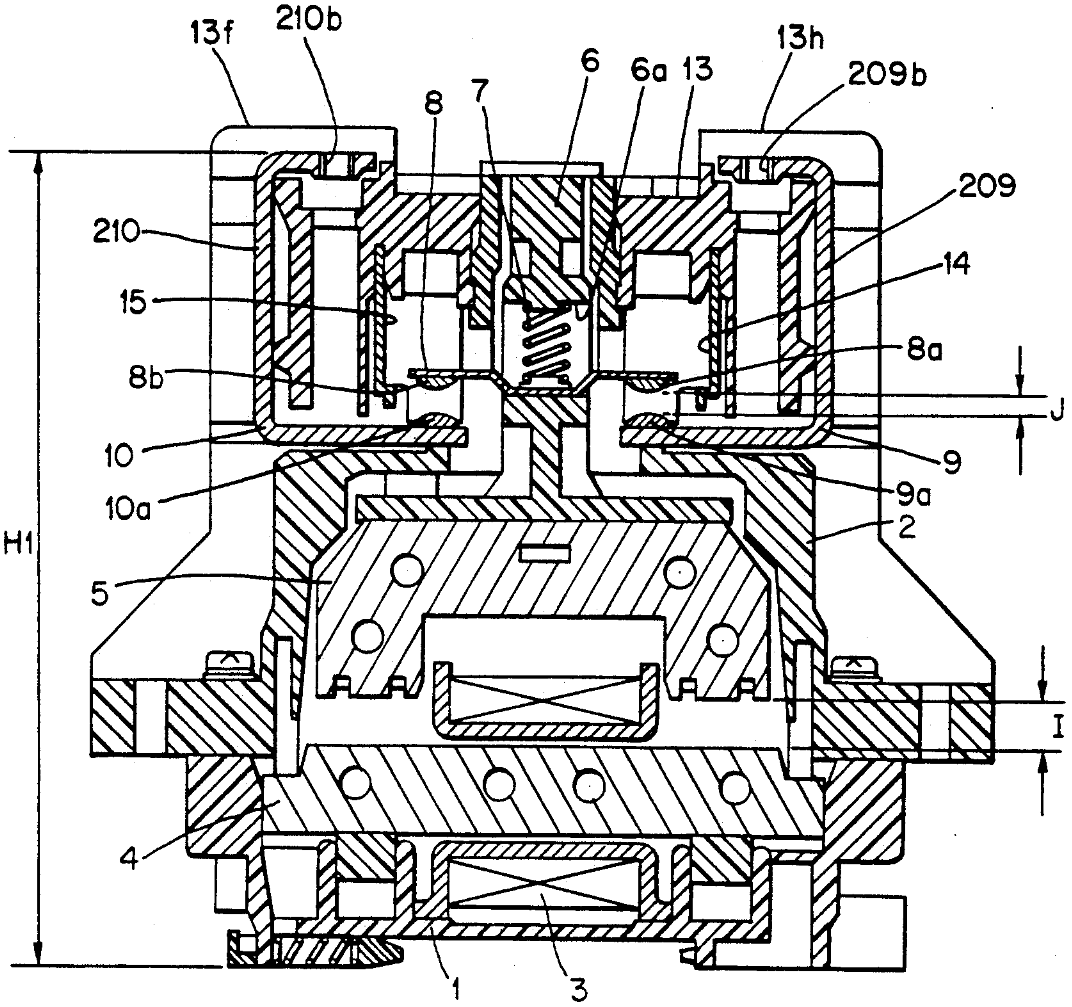
FIG. 4 is a cross sectional view taken on line IV—IV of FIG. 3.
Figure 11:
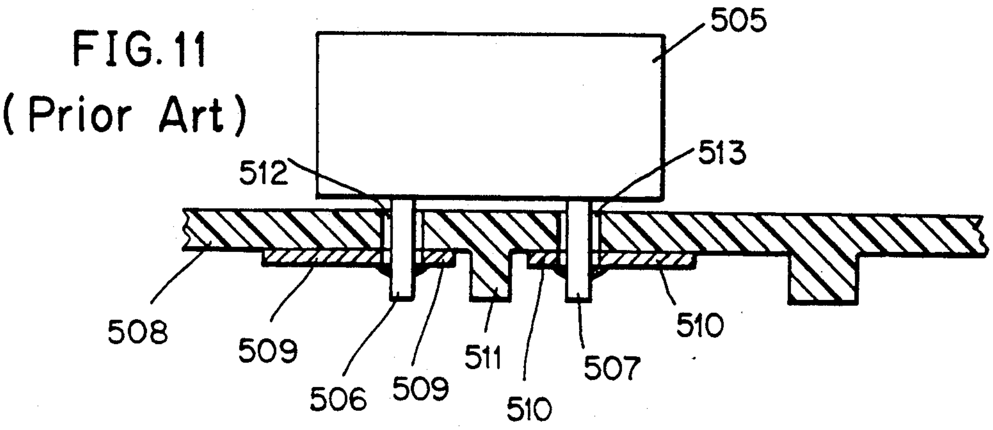
FIG. 11 (Prior Art)
FIG. 11 is the cross sectional view showing the relay mounted on the printed circuit board.
Figure 5:
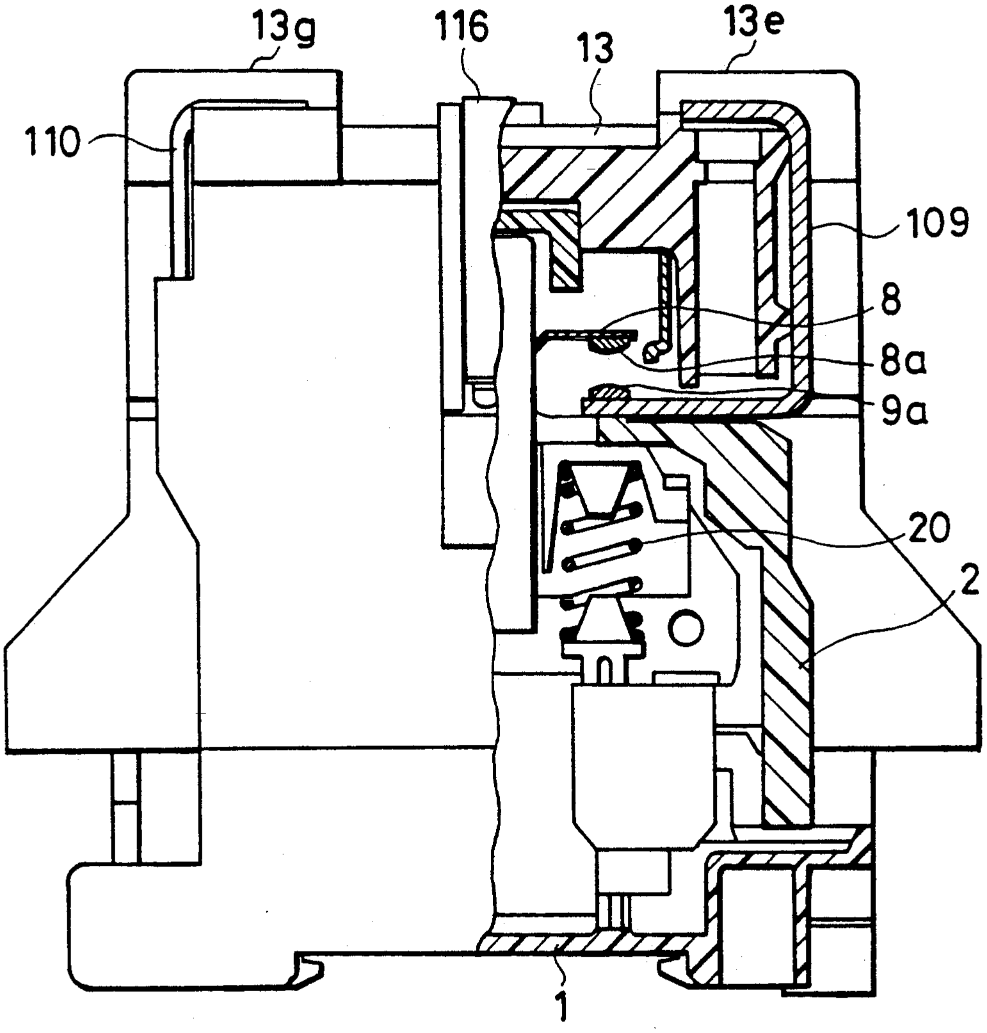
FIG. 5 is a side elevation view, partly in cross section taken on line V—V of FIG. 3.
Figure 6:
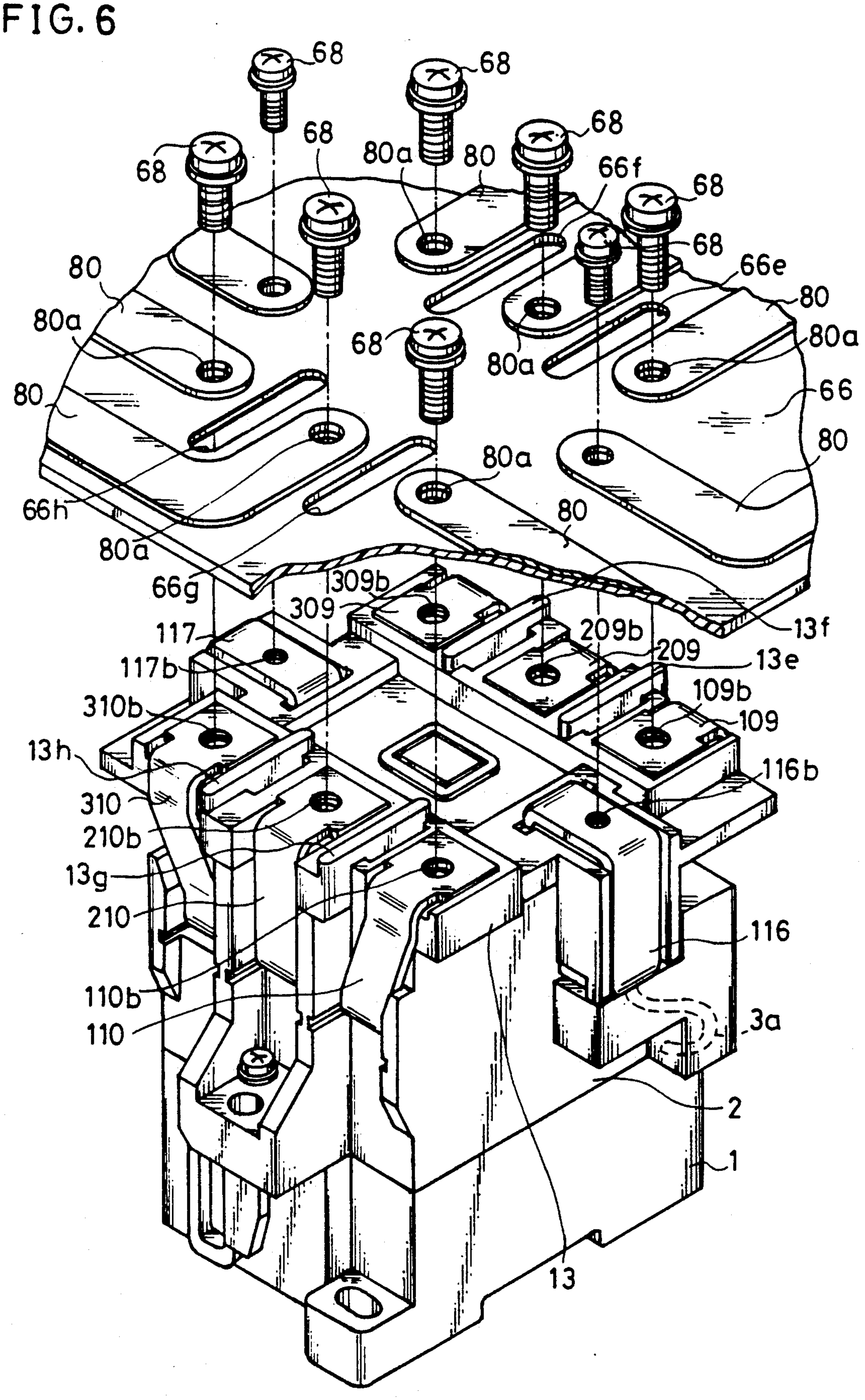
FIG. 6 is a perspective view showing a combination of a main circuit printed board and the electromagnetic contactor of FIG. 1.

FIG. 1 is a perspective view showing the electromagnetic contactor embodying the present invention. FIG. 2 is a front view of the electromagnetic contactor of FIG. 1. FIG. 3 is a top plan view showing the electromagnetic contactor of FIG. 1. FIG. 4 is a cross sectional plan view taken on line IV—IV of FIG. 3. FIG. 5 is a side elevation, partly in cross section view taken on line V—V of FIG. 3. FIG. 6 is a perspective view showing a combination of a main circuit printed board and the electromagnetic contactor of FIG. 1.

In FIG. 1 to FIG. 5, an electromagnetic contactor comprises a fitting base 1 for an apparatus, i.e. inverter apparatus. A contactor case 2 for receiving a contact unit of the electromagnetic contactor is mounted on the fitting base 1. As shown in FIGS. 1 to 3, input terminal plates 109, 209, 309 and output terminal plates 110, 210, 310 for connecting a three-phase circuit are provided on an upper part of the contactor case 2. Two control terminals 116, 117 are also provided on the upper part of the contractor case 2.

Both ends of the magnetic coil 3 shown in FIG. 4 are electrically connected to control terminals 116, 117, respectively. In FIG. 4, a stationary core 4 faces a movable core 5. A predetermined distance I separates the stationary core 4 and the movable core 5. A cross bar 6 made of insulation material is connected to the movable core 5. The cross bar 6 has a through-hole 6*a* which slidably holds a movable contact 8. The cross bar 6 is guided in a manner to slide upward and downward by the above-mentioned contactor case 2. A spring 7 for applying pressure to the movable contact 8 may include a compression coil spring. Movable contact points 8*a*, 8*b* are provided on both ends of the movable contact 8 to face fixed contact points 9*a*, 10*a* of stationary contacts 9, 10. As shown in FIG. 4, the movable contact points 8*a*, 8*b* in an open state have a predetermined distance J between the movable contact points 8*a*, 8*b* and the fixed contact points 9*a*, 10*a*. The fixed contact points 9*a*, 10*a* are screwed on one end of the stationary contacts 9, 10, respectively.

An arc cover 13 provided on an upper part of the contactor case 2 has metal arc runners 14, 15 therein for extinguishing an arc generated between movable contact points 8*a*, 8*b* and fixed contact points 9*a*, 10*a*. The stationary contacts 9, 10, movable contact 8 and arc runners 14, 15 are arranged in three sets next to one another corresponding to the three-phases of the current. In FIG. 4, the U-shaped input and output terminal plates 209, 210 have fixed contact points 9*a*, 10*a* on their lower ends. Top faces of the upper ends of the input and output terminal plates 209, 210 are on a substantially even level with an upper face of the arc cover 13 which is internal with the contactor case 2. The height to the top faces of the input and output terminal plates 209, 210 from the bottom face of the electromagnetic contactor is shown by H1 in FIG. 4.

The input terminal plates 109, 209, 309, and output terminal plates 110, 210, 310 are arranged in three adjacent sets corresponding to the three-phases of the circuit.

As shown in the top plan view of FIG. 3, four insulation ribs 13*e*, 13*f*, 13*g*, 13*h* made of insulating materials are provided on an upper face of the arc cover 13. Two insulation ribs 13*e*, 13*f* are arranged between three input terminal plates 109, 209, 309, and the other two insulation ribs 13*g*, 13*h* are arranged between three output terminal plates 110, 210, 310. The height to each respective insulation rib 13*e*, 13*f*, 13*g*, 13*h* from the top faces of the input terminal plates 109, 209, 309 and output terminal plates 110, 210, 310 is shown by $\beta$ in FIG. 2. Accordingly, a height H2 of the electromagnetic contactor is shown by the following formula (1):

$$H2 = H1 + \beta \quad (1)$$

wherein H1 is the height to the top face of the terminal plates 109, 209, 309, 110, 210, 310 from the bottom face of the fitting base 1.

As shown in FIG. 2, the U-shaped control terminal plates 116, 117 are provided on an upper part of the electromagnetic contactor. The lower ends of the control terminal plates 116, 117 are connected to lead wires 3*a*, 3*b* of the magnetic coil 3, respectively. The upper ends of the control terminal plates 116, 117 have threaded holes 116*b*, 117*b* for connection with a control circuit.

A spring 20 shown in FIG. 5 applies an upward force to the connecting unit of the cross bar 6 and the movable core 5.

FIG. 6 shows a perspective view of a combination of a main circuit printed board 66 and the above-mentioned electromagnetic contactor. As shown in FIG. 6, four oblong apertures 66*e*, 66*f*, 66*g*, 66*h* are provided in the main circuit printed board 66 to receive the above-mentioned insulation ribs 13*e*, 13*f*, 13*g*, 13*h* of the electromagnetic contactor. The oblong apertures 66*e*, 66*f*, 66*g*, 66*h* are similar in shape to the insulation ribs 13*e*, 13*f*, 13*g*, 13*h*.

Next, operation of the above-mentioned electromagnetic contactor embodying the present invention is described with reference to FIGS. 4 and 5.

When the magnetic coil 3 is energized by applying a voltage through the control terminals 116, 117, the movable core 5 is attracted to the stationary core 4 by the magnetic field of the magnetic coil 3. The connecting unit of the movable core 5 and the cross bar 6 slides downward against the force of the spring 20 shown in FIG. 5. As a result, the movable contact points 8*a*, 8*b* which are slid by the moving cross bar 6 touch the fixed contact points 9*a*, 10*a*. In an open state shown in FIG. 4, the core interval I between the stationary core 4 and the movable core 5 is designed to become larger than the contact interval J between the movable contact points 8*a*, 8*b* and the fixed contact point 9*a*, 10*a*. Therefore, the movable contact points 8*a*, 8*b* slide downward from the touch position to the fixed steadily contact points 9*a*, 10*a* so as to contact the fixed contact points 9*a*, 10*a*. At the same time, the spring 7 is compressed by the cross bar 6, and the force of the compressed spring 7 is applied to the movable contact 8 as contact pressure therefor.

Next, when the voltage is removed from the magnetic coil 3, the attraction between the stationary core 4 and the movable core 5 no longer exists. As a result, the connecting unit of the movable core 5 and the cross bar 6 more upward under the force of the spring 20, and the contact between the movable contact points 8*a*, 8*b* and the fixed contact points 9*a*, 9*b* is broken. An arc generated between the movable contact points 8*a*, 8*b* and the fixed contact points 9*a*, 9*b* at the above-mentioned breaking time is attracted to the arc runners 14, 15, and is extinguished.

The following is an explanation of the coupling operation of the main circuit printed board 66 and the above-mentioned electromagnetic contactor with reference to the accompanying drawing of FIG. 6.

As shown in FIG. 6, the electromagnetic contactor is directly connected to the main circuit printed board 66 by the bolts 68 being screwed into threaded holes 109*b*, 209*b*, 309*b*, 110*b*, 210*b*, 310*b* of the input terminal plates 109, 209, 309, and the output terminal plates 110, 210, 310, respectively, through terminal holes 80*a* of the printed circuit 80 in the main circuit printed board 66. The wiring for the electromagnetic contactor is finished by only connecting the electromagnetic contactor to the main circuit printed board 66. In the above-mentioned coupling operation for the wiring, the insulation ribs 13*e*, 13*f*, 13*g*, 13*h* of the electromagnetic contactor are inserted in the oblong apertures 66*e*, 66*f*, 66*g*, 66*h* of the main circuit printed board 66. Therefore, the distance for insulation, the creepage distance, between the terminals of the printed circuit 80 in the main circuit printed board 66 increases by projecting the insulation ribs 13*e*, 13*f*, 13*g*, 13*h* from the upper face of the main circuit printed board 66.

Figure 7:
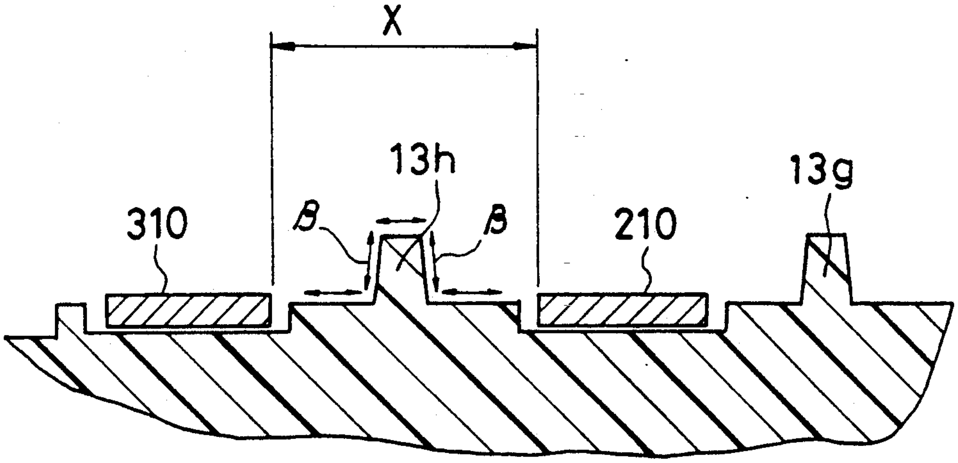
FIG. 7 is a cross sectional view showing a creepage distance as an insulation distance between terminal plates of the electromagnetic contactor.

FIG. 7 is a cross sectional view showing the creepage distance between the output terminal plates 210, 310. As shown in FIG. 7, the insulation distance between the output terminal plates 210, 310 is longer, by at least twice ($2\beta$) the projection height $\beta$ of the insulation ribs 13*h*, than the interval X along a shortest straight line between the output terminal plates 210, 310. Therefore, since the insulation distance (creepage distance) becomes longer by providing insulation ribs 13*e*, 13*f*, 13*g*, 13*h*, the interval X along a shortest straight line distance between the terminals can be shortened. As a result, an apparatus having electrical equipment coupled to a printed circuit board embodying the present invention can be made relatively small at a low manufacturing cost.

Since the insulation ribs 13*e*, 13*f*, 13*g*, 13*h* of the electrical equipment are coupled with the oblong apertures 66*e*, 66*f*, 66*g*, 66*h* of the printed circuit board 66, the aforementioned conventional printed circuit board having projections and being difficult to manufacture is no longer necessary. The above-mentioned flat printed circuit board 66 having the oblong apertures 66*e*, 66*f*, 66*g*, 66*h* for inserting the insulation ribs 13*e*, 13*f*, 13*g*, 13*h* is easily manufactured at low cost.

Even if floating dust or suspended particulate stick on the main circuit printed board 66, and the accumulated material absorbs moisture, the insulation distance between the terminals of the main circuit printed board 66 can be protected by projecting the insulation ribs 13*e*, 13*f*, 13*g*, 13*h* from the oblong apertures 66*e*, 66*g*, 66*g*, 66*h* of the main circuit printed board 66.

Figure 8:
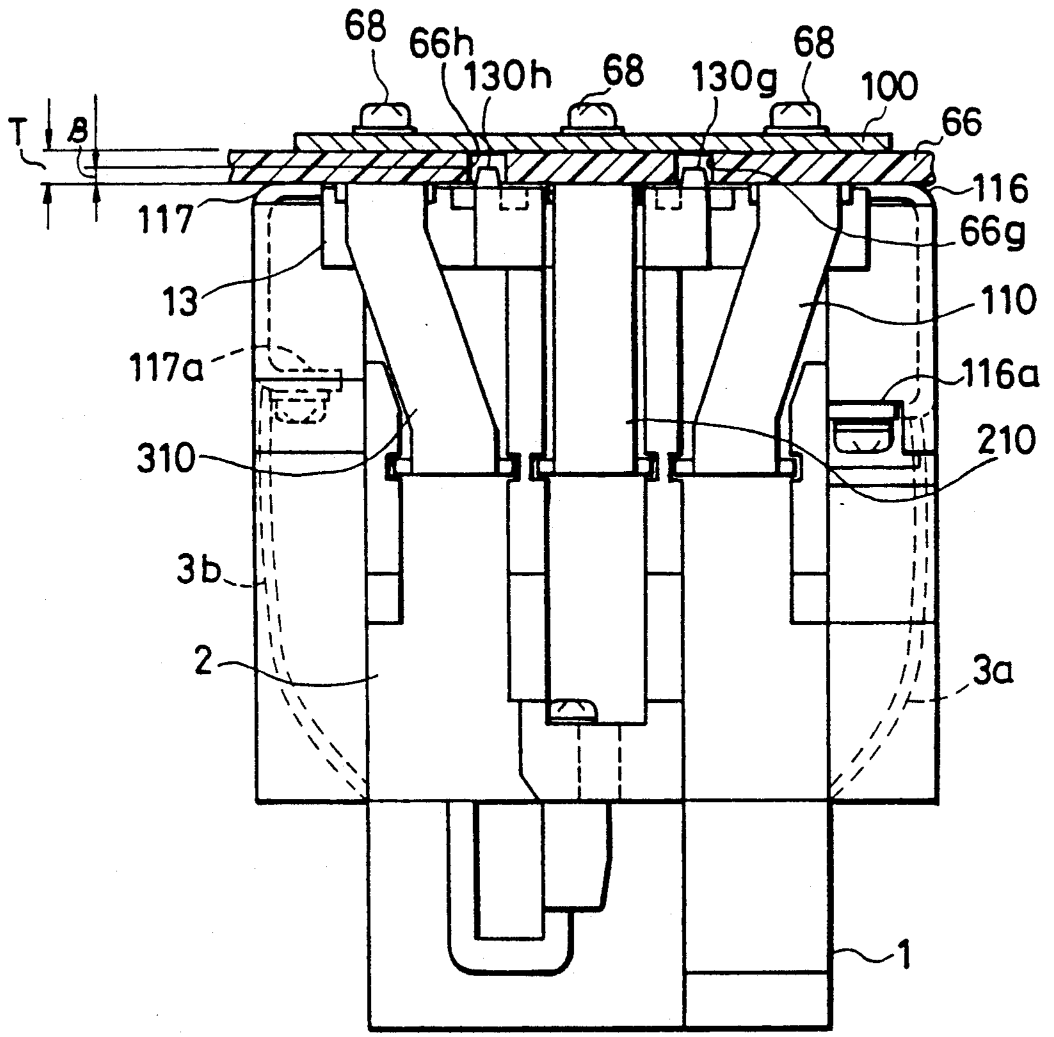
FIG. 8 is a front view showing another electromagnetic contactor embodying the present invention.
Figure 9:
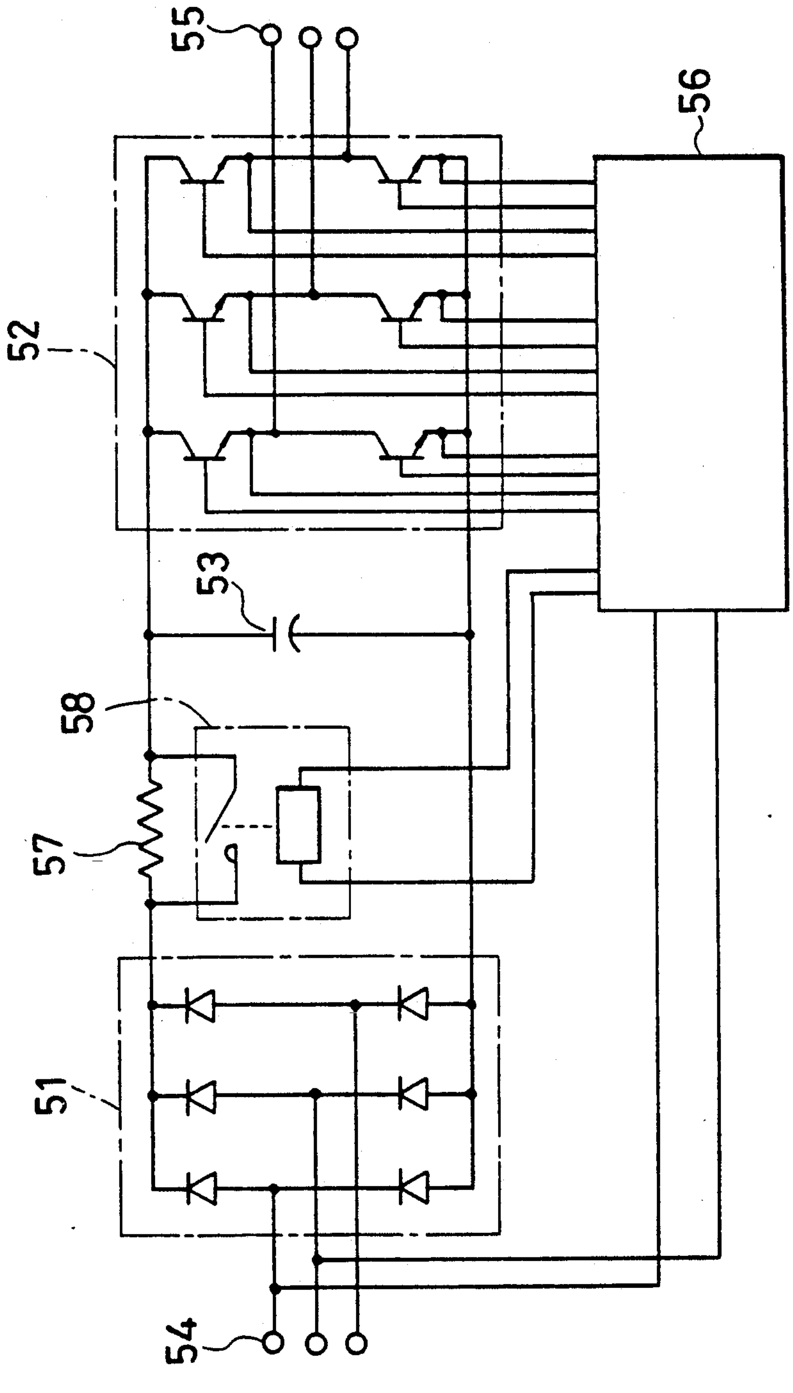
FIG. 9 (Prior Art)
FIG. 9 is the basic circuit diagram of a conventional inverter apparatus.
Figure 10:
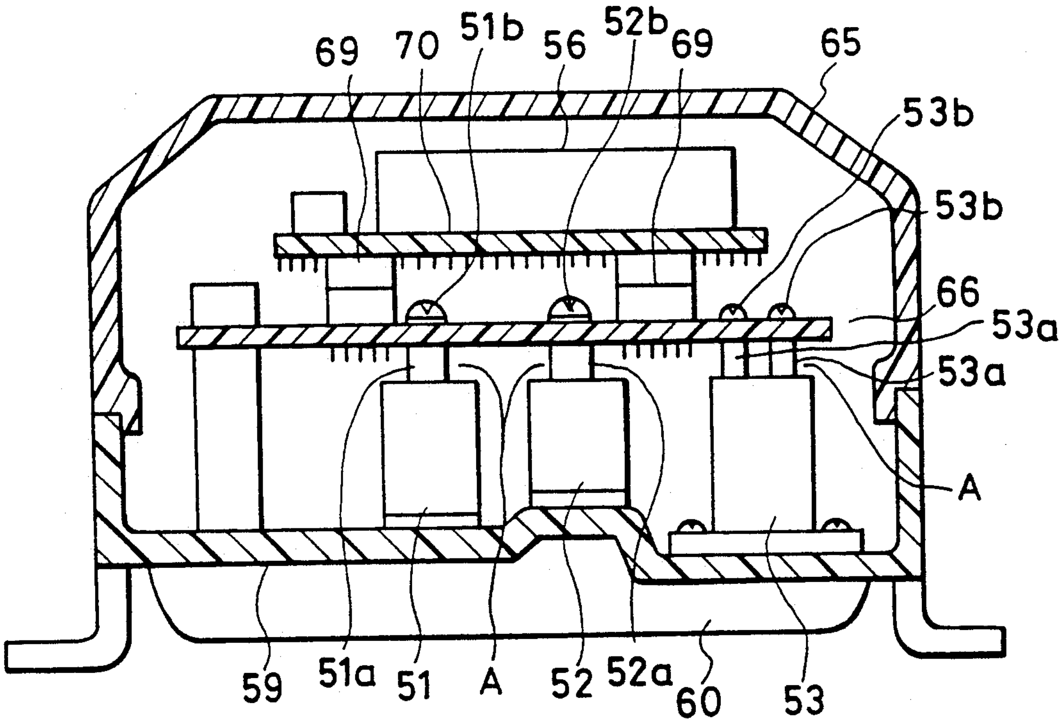
FIG. 10 (Prior Art)
FIG. 10 is the cross sectional view showing the structure of the conventional semi-conductor circuit apparatus.

FIG. 8 shows a front view of another electromagnetic contactor embodying the present invention. Parts and components corresponding to parts and components in the aforementioned embodiment are shown by the same numerals As shown in FIG. 8, the electromagnetic contactor provides the insulation ribs 130*g*, 130*h* with a projection height $\beta$ from the upper face of the output terminal plates 110, 210, 310 and input terminal plates. The projection height $\beta$ is selected smaller than the thickness T of the main circuit printed board 66. Therefore, when a connecting conductor 100 connects the three-phase output terminal plates 110, 210, 310, and when another connecting conductor 100 connects the three-phase input terminal plates, in case of the aforementioned inverter circuit shown in FIG. 9, the connecting conductors 100 can be mounted on the main circuit printed board 66 without interfering with the insulation ribs 130*g*, 130*h*.

Apart from the above-mentioned embodiment wherein the insulation ribs are provided between the terminal plates of the electromagnetic contactor, insulation rib may be provided between a terminal plate and a control terminal plate of the electrical equipment.

Apart from the above-mentioned embodiment wherein the insulation ribs are provided on the electromagnetic contactor, the insulation ribs may be provided on the terminal section of other electrical equipment, such as a solid-state contactor, a power relay, a diode module, a transistor module, a capacitor or the like. Thereby the the reliability of an apparatus which uses the electrical equipment coupled to the printed circuit board can be improved.

Although the present invention has been described in terms of the presently preferred embodiments, it is to be understood that such disclosure is not to be interpreted as limiting. Various alternations and modifications will no doubt become apparent to those skilled in the art after having read the above disclosure. Accordingly, it is intended that the appended claims be interpreted as covering all alterations and modifications which fall within the true spirit and scope of the invention.

What is claimed is:

1. An electrical component coupled to a printed circuit board, comprising:

a case having at least one substantially flat face, plural terminal plates connected to circuit parts on said printed circuit board, at least a part of said plural terminal plates being formed on said at least one substantially flat face, and said at least a part of said plural terminal plates having connecting means for connection to said printed circuit board, at least one insulation rib projecting from said at least one substantially flat face of said case between a pair of adjacent terminal plates to assure a long creepage distance between said plural terminal plates and above said at least one substantially flat face.

2. The electrical component coupled to the printed circuit board in accordance with claim 1, wherein said at least one insulation rib is inserted into a corresponding hole of said printed circuit board for electrical connection with said plural terminal plates.

3. The electrical component coupled to the printed circuit board in accordance with claim 1, wherein said at least one insulation rib has a height which causes said at least one insulation rib to project from said at least one substantially flat face, said height being smaller than a thickness of said printed circuit board.

4. The electrical component coupled to printed circuit board in accordance with claim 1, wherein said plural terminal plates include three-phase input terminal plates, three-phase output terminal plates and control terminal plates of an electromagnetic contactor.

5. The electrical component coupled to the printed circuit board in accordance with claim 4, wherein said three-phase input terminal plates are electrically connected to each other by a first conductor mounted on said printed circuit board, and said three-phase output terminal plates are electrically connected by a second conductor mounted on said printed circuit board.

6. An electrical component configured for attachment to a printed circuit board having a plurality of circuit traces, the electrical component comprising:

a case having a first surface which is substantially flat;

a plurality of terminal plates for connection to said plurality of circuit traces, each of said terminal plates having a first portion formed on said first surface, said first portion including means for connecting said first portion to a respective one of said plurality of circuit traces on said printed circuit board; and at least one insulation rib arranged to project from said at least one substantially flat face of said case between at least one pair of adjacent terminal plate to increase a creepage distance between said adjacent terminal plates.

7. Apparatus comprising:

a printed circuit board having a plurality of circuit traces; and an electrical component connected to said printed circuit board, said electrical component including a case having a first surface which is substantially flat, a plurality of terminal plates for connection to said plurality of circuit traces, each of said terminal plates having a first portion formed on said first surface, said first portion including means for connecting said first portion to a respective one of said plurality of circuit traces on said printed circuit board, and at least one insulation rib arranged to project from said at least one substantially flat face of said case between at least one pair of adjacent terminal plates to increase a creepage distance between said adjacent terminal plates.

8. Apparatus comprising:

a printed circuit board having a plurality of circuit traces and at least one hole; and an electrical component connected to said printed circuit board, said electrical component including a case having a first surface which is substantially flat, a plurality of terminal plates for connection to said plurlaity of circuit traces, each of said terminal plates having a first portion formed on said first surface, said first portion including means for connecting said first portion to a respective one of said plurality of circuit traces on said printed circuit board, and at least one insulation rib arranged to project from said at least one substantially flat face of said case between at least one pair of adjacent terminal plates into said at least one hole.

9. Apparatus as claimed in claim 8, wherein said at least one insulation rib projects from said first surface by a height whcih is less than a thickness of said printed circuit board.

10. Apparatus comprising:

a printed circuit board having a plurality of circuit traces; and an electrical component connected to said printed circuit board, said electrical component including a case having a first surface which is substantially flat, a plurality of terminal plates for connection to said plurality of circuit traces, said plurality of terminal plates a plurality of three-phase input terminal plates, a plurality of three-phase output terminal plates, and at least one control terminal plate, each of said terminal plates having a first portion formed on said first surface, said first portion including means for connecting said first portion to a respective one of said plurality of circuit traces on said printed circuit board, and at least one insulation rib arranged to project from said at least one substantially flat face of said case between at least one pair of adjacent terminal plates to increase a creepage distance between said adjacent terminal plates.

11. Apparatus as claimed in claim 10, further comprising:

a first conductor mounted on said printed circuit board and electrically interconnecting said plurality of three-phase input terminal plates; and a second conductor mounted on said printed circuit board and electrically interconnecting said plurality of three-phase output terminal plates.

* * * * *